(12) United States Patent
Mori

(10) Patent No.: US 12,745,595 B2
(45) Date of Patent: Sep. 22, 2026

(54) METHOD OF MEASURING POSITIONAL DEVIATION OF SUBSTRATE STAGE AND SUBSTRATE PROCESSING APPARATUS

(71) Applicant: Tokyo Electron Limited, Tokyo (JP)

(72) Inventor: Kiyoshi Mori, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 503 days.

(21) Appl. No.: 18/384,115

(22) Filed: Oct. 26, 2023

(65) Prior Publication Data

US 2024/0145278 A1 May 2, 2024

(30) Foreign Application Priority Data

Oct. 28, 2022 (JP) ................................ 2022-173448

(51) Int. Cl.
*H10P 72/00* (2026.01)
*H10P 72/76* (2026.01)

(52) U.S. Cl.
CPC ...... *H10P 72/0606* (2026.01); *H10P 72/7618* (2026.01)

(58) Field of Classification Search
None
See application file for complete search history.

(56) References Cited

U.S. PATENT DOCUMENTS

2015/0371883 A1* 12/2015 Takahashi ........... H10P 72/0606 438/5
2022/0172967 A1* 6/2022 Topping .............. H10P 72/0464
2023/0191449 A1* 6/2023 Takano .................... B05D 3/12 438/689

FOREIGN PATENT DOCUMENTS

JP 2022-106560 A 7/2022
JP 2022-107898 A 7/2022
KR 1020160010334 A 1/2016
KR 1020220099900 A 7/2022

* cited by examiner

*Primary Examiner* — Adam R Mott
*Assistant Examiner* — Alan Lindsay Ostrow
(74) *Attorney, Agent, or Firm* — Nath, Goldberg & Meyer; Jerald L. Meyer; Tanya E. Harkins

(57) ABSTRACT

A method of measuring a positional deviation of a substrate stage in a substrate processing apparatus provided rotatably inside a processing container, includes: detecting an initial position of a substrate transferred by an arm that transfers the substrate; placing the substrate on the substrate stage; rotating the substrate by a predetermined rotational angle by rotating the substrate stage; delivering the substrate after rotation from the substrate stage to the arm; detecting a position of the substrate after rotation transferred by the arm; and calculating the positional deviation amount of the substrate stage with respect to the initial position of the substrate based on the initial position of the substrate, the position of the substrate after rotation, and the rotational angle.

10 Claims, 11 Drawing Sheets

RPU
531
532
50
53
54
55
M1
M2
M3
V1
V2
V3
V11
V14
52
510
51
W
4
2
41
40
20
700
600
34
7
71
72
721
722
73
74
61
62
P
T
S1
S3

METHOD OF MEASURING POSITIONAL DEVIATION OF SUBSTRATE STAGE AND SUBSTRATE PROCESSING APPARATUS

CROSS-REFERENCE TO RELATED APPLICATION

This application is based upon and claims the benefit of priority from Japanese Patent Application No. 2022-173448, filed on Oct. 28, 2022, the entire contents of which are incorporated herein by reference.

TECHNICAL FIELD

The present disclosure relates to a method of measuring a positional deviation of a substrate stage and a substrate processing apparatus.

BACKGROUND

Patent document 1 discloses calculating an actual position of a substrate held by a substrate holder based on detection data of a substrate detection sensor, calculating a correction value for a set logical position, and correcting the transfer position of the substrate based on the correction value. Patent Document 2 discloses a sensor that is located between adjacent processing spaces and is capable of detecting a position of a wafer held by a rotation arm during a rotating motion of the rotation arm.

PRIOR ART DOCUMENTS

Patent Documents

Patent Document 1: Japanese Patent Laid-Open Publication No. 2022-107898

Patent Document 2: Japanese Patent Laid-Open Publication No. 2022-106560

SUMMARY

According to one embodiment of the present disclosure, a method of measuring a positional deviation of a substrate stage in a substrate processing apparatus provided rotatably inside a processing container, includes: detecting an initial position of a substrate transferred by an arm that transfers the substrate; placing the substrate on the substrate stage; rotating the substrate by a predetermined rotational angle by rotating the substrate stage; delivering the substrate after rotation from the substrate stage to the arm; detecting a position of the substrate after rotation transferred by the arm; and calculating a positional deviation amount of the substrate stage with respect to the initial position of the substrate based on the initial position of the substrate, the position of the substrate after rotation, and the rotational angle.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a schematic plan view illustrating an example of a configuration of a substrate processing system according to an embodiment.

DETAILED DESCRIPTION

Figure 2:
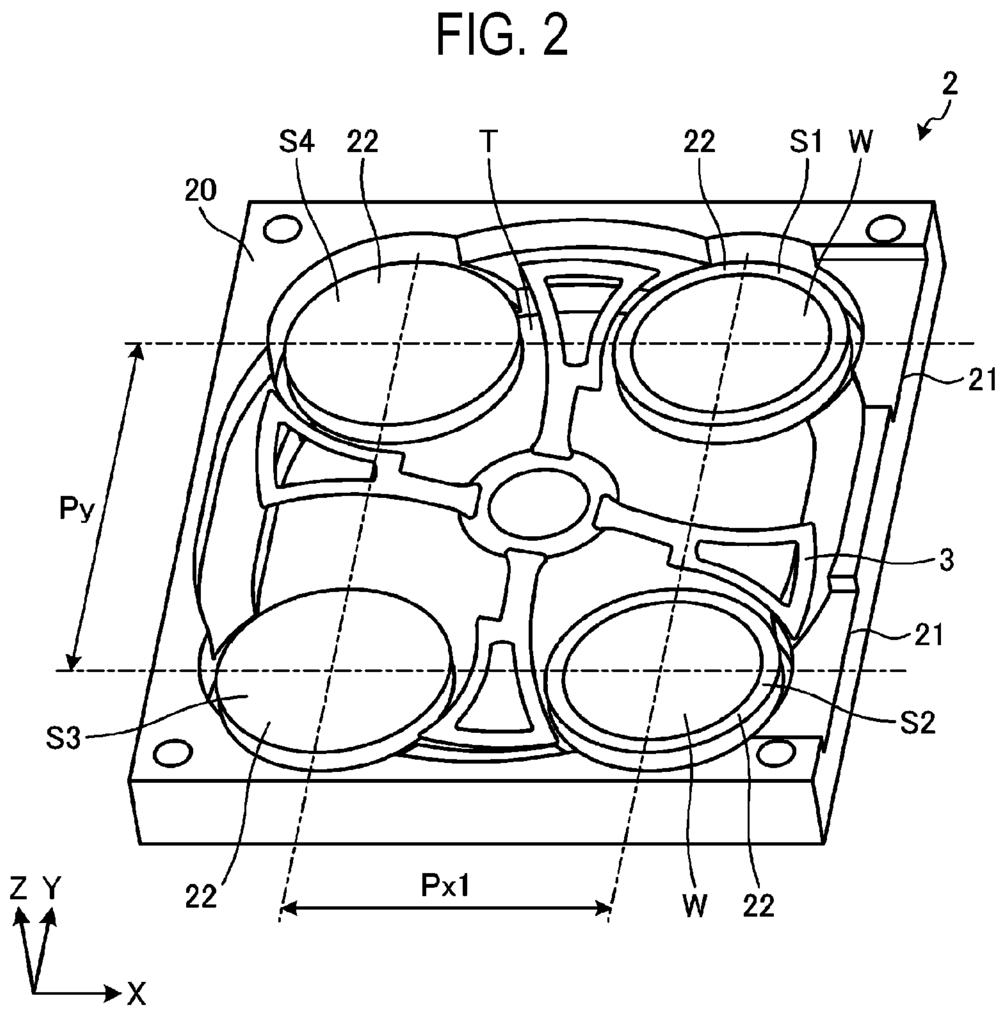
FIG. 2 is an exploded perspective view illustrating an example of the configuration of the substrate processing apparatus according to the embodiment.

Hereinafter, embodiments of a method of measuring a positional deviation of a substrate stage and a substrate processing apparatus disclosed herein will be described in detail with reference to the drawings. The technology disclosed herein is not limited by the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a substrate processing apparatus, due to an error in the installation position of a substrate stage provided inside a processing container and thermal expansion of the processing container, a relative positional deviation between the substrate stage and the substrate transferred to the substrate stage may occur. When a relative positional deviation exists between the substrate stage and the substrate, the properties of the substrate after processing may deteriorate. In this regard, visual confirmation of a relative positional deviation amount between a substrate stage and a substrate is performed periodically. However, with visual confirmation, it is difficult to measure the relative positional deviation amount between the substrate stage and the substrate with high accuracy. In addition, for example, in a substrate processing apparatus in which a plurality of substrates are processed simultaneously in one processing chamber, since a plurality of substrate stages on each of which a substrate is placed are also provided, the work time required for visually confirming all the substrates is also lengthened. Therefore, it is desired to simply and quickly measure a relative positional deviation amount between a substrate stage and a substrate.

Embodiment

[Configuration of Substrate Processing System]

Figure 1:
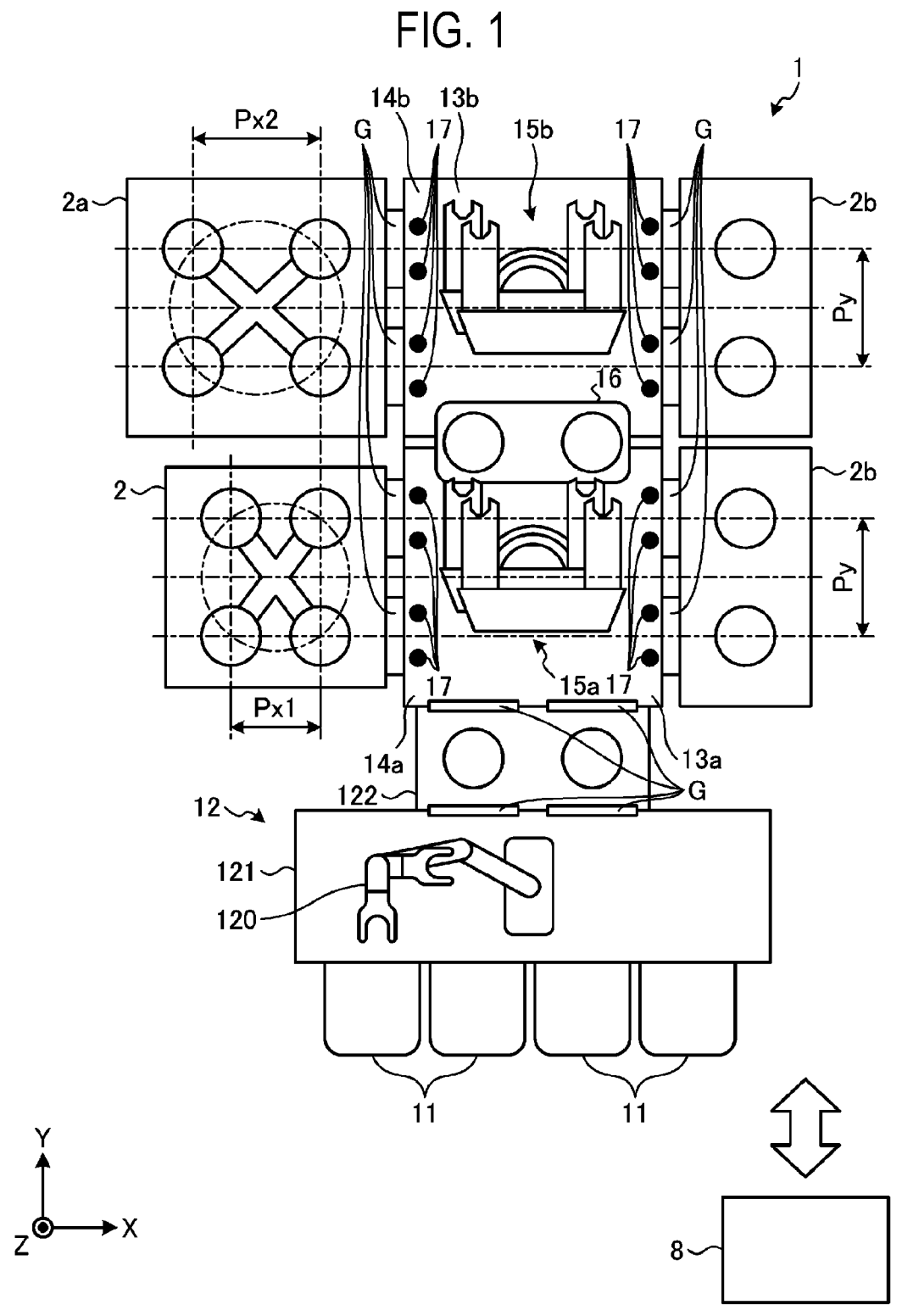

FIG. 1 is a schematic plan view illustrating an example of a configuration of a substrate processing system according to the present embodiment. The substrate processing system 1 illustrated in FIG. 1 includes loading/unloading ports 11, a carry-in/out module 12, vacuum transfer modules 13*a* and 13*b*, and substrate processing apparatuses 2, 2*a*, and 2*b*. Referring to FIG. 1, a description is made assuming that an X direction is the left-right direction, a Y direction is the front-rear direction, a Z direction is the up-down direction (height direction), and the loading/unloading ports 11 are located on the front side in the front-rear direction. The loading/unloading ports 11 are connected to the front side of the carry-in/out module 12, and the vacuum transfer module 13*a* is connected to the rear side of the carry-in/out module 12 in the front-rear direction.

Carriers, which are transfer containers accommodating substrates to be processed, are placed on the loading/unloading ports 11, respectively. The substrates are wafers W, which are circular substrates having a diameter of, for example, 300 mm. The carry-in/out module 12 is a module configured to perform carry-in/out of the wafers W between the carriers and the vacuum transfer module 13*a*. The carry-in/out module 12 includes a normal-pressure transfer chamber 121 in which the wafers W are delivered to and from the carriers in a normal-pressure atmosphere by a transfer mechanism 120, and a load-lock chamber 122 configured to switch the atmosphere in which the wafers W are placed between the normal-pressure atmosphere and a vacuum atmosphere.

The vacuum transfer modules 13*a* and 13*b* have vacuum transfer chambers 14*a* and 14*b*, respectively, in which a vacuum atmosphere is formed. Transfer arms 15*a* and 15*b* are disposed inside the vacuum transfer chambers 14*a* and 14*b*, respectively. Between the vacuum transfer module 13*a* and the vacuum transfer module 13*b*, a path 16 in which the delivery of the wafer W is performed between the vacuum transfer modules 13*a* and 13*b* is disposed. Each of the vacuum transfer chambers 14*a* and 14*b* is formed in, for example, a rectangular shape in a plan view. In four sidewalls of the vacuum transfer chamber 14*a*, the substrate processing apparatuses 2 and 2*b* are connected to the sides, respectively, which face each other in the left-right direction. In the four sidewalls of the vacuum transfer chamber 14*b*, the substrate processing apparatuses 2*a* and 2*b* are connected to the sides, respectively, which face each other in the left-right direction.

In addition, in the four sidewalls of the vacuum transfer chamber 14*a*, the load-lock chamber 122 installed in the carry-in/out module 12 is connected to the front side. Gate valves G are arranged between the normal-pressure transfer chamber 121 and the load-lock chamber 122, between the load-lock chamber 122 and the vacuum transfer module 13*a*, and between the vacuum transfer modules 13*a* and 13*b* and the substrate processing apparatuses 2, 2*a*, and 2*b*. The gate valves G open and close loading/unloading ports for the wafer W, which are provided in mutually connected modules, respectively.

The transfer arm 15*a* transfers the wafers W among the carry-in/out module 12, the substrate processing apparatuses 2 and 2*b*, and the path 16 in the vacuum atmosphere. In addition, the transfer arm 15*b* transfers the wafers W among the path 16 and the substrate processing apparatuses 2*a* and 2*b* in the vacuum atmosphere. The transfer arms 15*a* and 15*b* are configured as articulated arms, and include substrate holders configured to hold the wafers W, respectively. The substrate processing apparatuses 2, 2*a*, and 2*b* collectively process a plurality of (e.g., two or four) wafers W by using a processing gas in a vacuum atmosphere. Therefore, the substrate holders of the transfer arms 15*a* and 15*b* are configured to be capable of simultaneously holding, for example, two wafers W so as to collectively deliver two wafers W to the substrate processing apparatuses 2, 2*a*, and 2*b*. In each substrate processing apparatus 2 or 2*a*, the wafers W received by the stages located closer to the vacuum transfer module 13*a* or 13*b* may be transferred to the stages located at the inner side by the rotation arm provided inside the substrate processing apparatus.

In addition, the vacuum transfer chambers 14*a* and 14*b* include a plurality of sensors 17. The sensors 17 are, for example, optical sensors in which two optical sensors form one set, and one set is arranged corresponding to each loading/unloading port in the substrate processing apparatuses 2, 2*a*, and 2*b*. The sensors 17 detect positions of the wafers W transferred by the transfer arms 15*a* and 15*b*. For example, the sensors 17 are capable of detecting the center positions of the wafers W based on the information on the peripheral edge positions of the wafers W. The sensors 17 output detection results indicating the positions of the wafers W to a controller 8, which will be described later.

Since the pitch of the stages in the Y direction (row interval) is a pitch Py that is common to the substrate processing apparatuses 2, 2*a*, and 2*b*, the substrate processing apparatuses 2, 2*a*, and 2*b* may be connected to any locations on the sides of the vacuum transfer modules 13*a* and 13*b* that are opposite to each other in the left-right direction. In the example of FIG. 1, the substrate processing apparatus 2 and a substrate processing apparatus 2*b* are connected to the vacuum transfer module 13*a*, and the substrate processing apparatus 2*a* and another substrate processing apparatus 2*b* are connected to the vacuum transfer module 13*b*. The substrate processing apparatus 2 and the substrate processing apparatus 2*a* differ from each other in the diameter of a reactor including a processing space corresponding to one stage according to a process application, and have different pitches Px1 and Px2, which are pitches of the stages in the X direction (column intervals). In the substrate processing apparatus 2*a*, the pitch Px2 has the same value as the pitch Py. That is, the pitch Py corresponds to the size of the largest reactor. That is, since the size of the reactor of the substrate processing apparatus 2 is smaller than that of the substrate processing apparatus 2*a*, the pitch Px1 may be set to be smaller than the pitch Px2.

The internal configuration of the substrate processing apparatus 2*a* is fundamentally the same as that of the substrate processing apparatus 2, except that the pitch Px2 is different from the pitch Px1, and the description thereof will be omitted. Each substrate processing apparatus 2*b* is of a type of substrate processing apparatus which includes two stages and in which wafer transfer is not performed, and two wafers are simultaneously loaded into and processed in the substrate processing apparatus 2*b* and are then simultaneously unloaded from the substrate processing apparatus 2*b*.

The substrate processing system 1 includes a controller 8. The controller 8 is, for example, a computer including a processor, a storage, an input device, a display device, and the like. The controller 8 controls each part of the substrate processing system 1. With the controller 8, an operator may perform a command input operation or the like by using the input device in order to manage the substrate processing system 1. In addition, in the controller 8, the operation state of the substrate processing system 1 may be visualized and displayed by the display device. In addition, the storage of the controller 8 stores a control program, recipe data, and the like used by the processor to control various processes executed by the substrate processing system 1. The processor of the controller 8 executes the control program to control each part of the substrate processing system 1 according to the recipe data, whereby desired substrate processing is executed in the substrate processing system 1.

[Configuration of Substrate Processing Apparatus]

Next, an example in which the substrate processing apparatus 2 is applied to, for example, a film forming apparatus that performs a plasma chemical vapor deposition (CVD) process on the wafers W will be described with reference to FIGS. 2 to 7. FIG. 2 is an exploded perspective view illustrating an example of a configuration of the substrate processing apparatus according to the present embodiment. As illustrated in FIG. 2, the substrate processing apparatus 2 includes a processing container (vacuum container) 20 having a rectangular shape in a plan view. The processing container 20 is configured to maintain the interior thereof in a vacuum atmosphere. The processing container 20 is constructed by closing an open portion in the top surface thereof with a gas supplier 4 and a manifold 36, which will described later. In FIG. 2, internal partition walls and the like are omitted such that the relationship between the processing spaces S1 to S4 and the rotation arm 3 may be easily understood. The processing container 20 includes two loading/unloading ports 21 formed in the side surface thereof connected to the vacuum transfer chamber 14*a* or 14*b* to be arranged in the Y direction. The loading/unloading ports 21 are opened/closed by gate valves G, respectively (see FIG. 1).

A plurality of processing spaces S1 to S4 are provided inside the processing container 20. Stages 22 (an example of substrate stages) are disposed in the processing spaces S1 to S4, respectively. The stages 22 are movable in the up-down direction, so that the stages 22 move upward when the wafers W are processed and move downward when the wafers W are transferred. A transfer space T, which is connected to the processing spaces S1 to S4 and in which the wafers W are transferred by the rotation arm 3, is provided below the processing spaces S1 to S4. In addition, the transfer space T below the processing spaces S1 and S2 is connected to each loading/unloading port 21 so that carrier-in/out of the wafers W is performed between the vacuum transfer chamber 14*a* or 14*b* (see FIG. 1) and the transfer space T by the transfer arms 15*a* or 15*b* (see FIG. 1).

The respective stages 22 in the processing spaces S1 to S4 are laid out in 2 rows and 2 columns when viewed from the top side. The layout has different dimensions for row and column intervals. That is, when comparing the pitch Py in the Y-direction pitch of the stages 22 (row interval) and the pitch Px1 in the X-direction pitch (column interval), the pitch Py is greater than the pitch Px1.

Figure 3:
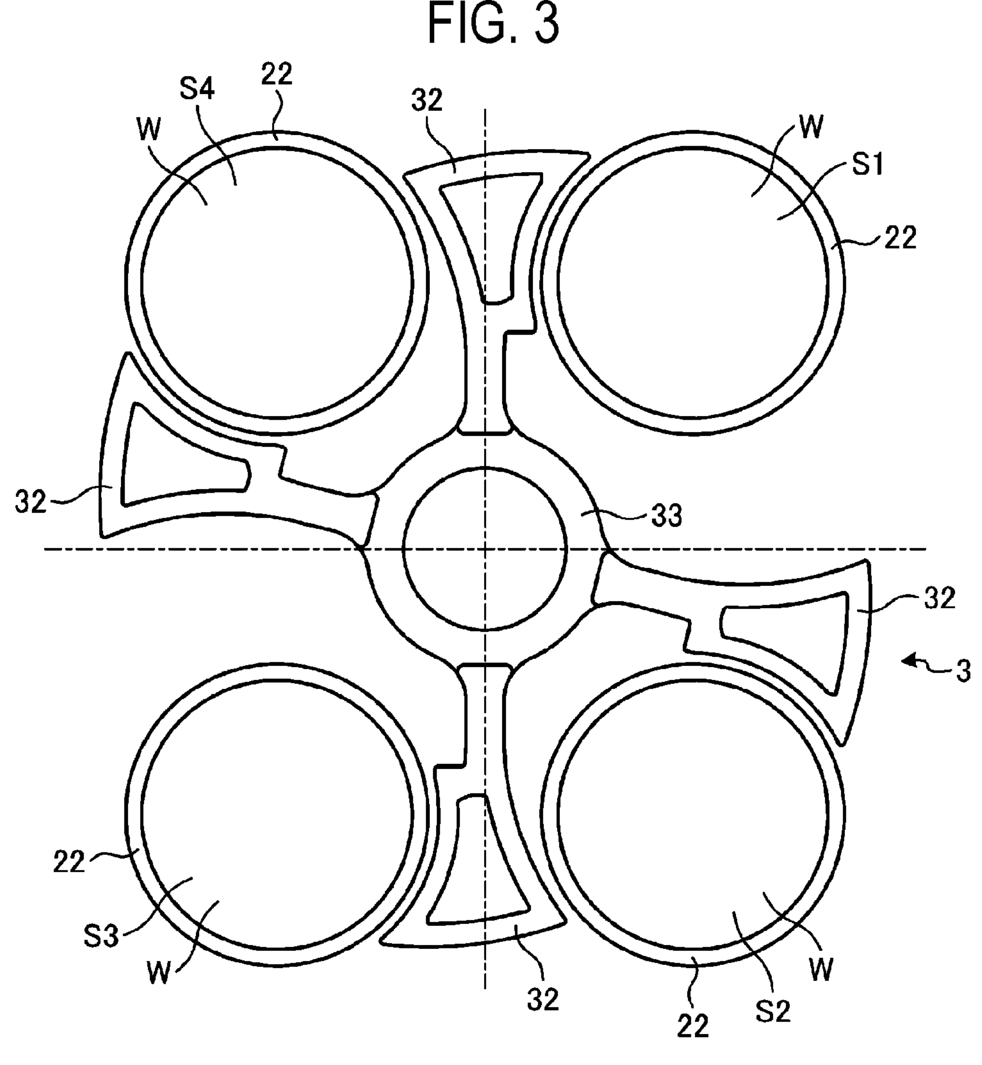
FIG. 3 is a view illustrating an example of a positional relationship between processing spaces and a rotation arm at a standby position.
Figure 4:
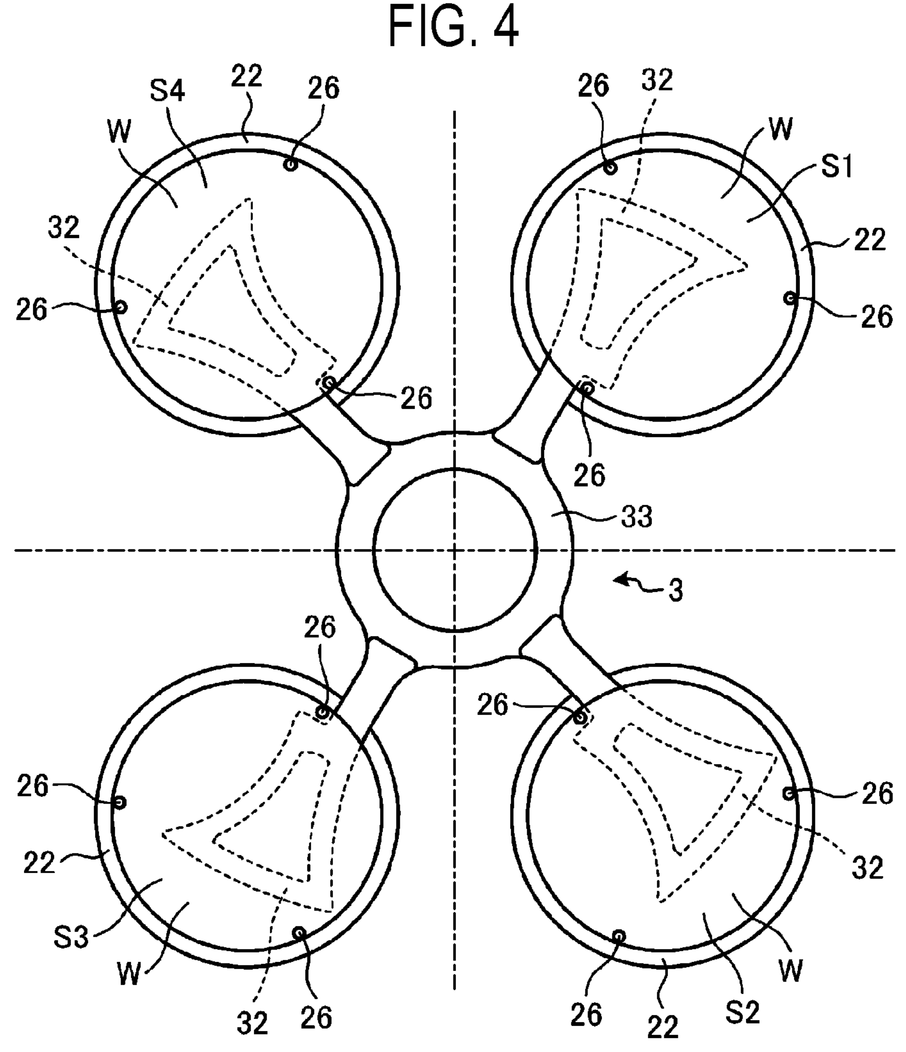
FIG. 4 is a view illustrating an example of a positional relationship between the processing spaces and the rotation arm at a wafer holding position.

FIG. 3 is a view illustrating an example of a positional relationship between the processing spaces and the rotation arm at a standby position. FIG. 4 is a view illustrating an example of a positional relationship between the processing spaces and the rotation arm at a wafer holding position. As illustrated in FIGS. 3 and 4, the rotation arm 3 includes four end effectors 32 capable of holding the wafers W to be placed on the stages 22, respectively, and a base member 33 having a rotation axis at the center position of the two-row and two-column layout. The four end effectors 32 are connected to the base member 33 to form an X shape. The X shape in the rotation arm 3 has a configuration in which the dimension in the Y direction, which corresponds to the row interval of the X shape, and the dimension in the X direction, which corresponds to the column interval of the X shape, are different from each other at the holding position of the wafer W illustrated in FIG. 4.

At the standby position illustrated in FIG. 3, the rotation arm 3 is disposed between each two adjacent ones of the processing spaces S1 to S4, and thus does not disrupt the movement of each stage 22 in the up-down direction. FIG. 3 illustrates the state in which the wafers W are placed on the stages 22, respectively. A description will be made of the movement of the rotation arm 3 from this state, for example, when the wafers W are transferred such that the wafers W in the first column and the wafers W in the second column are replaced with each other, that is, when the wafers W in the processing spaces S1 and S2 are transferred to the processing spaces S3 and S4, and the wafers W in the processing spaces S3 and S4 are transferred to the processing spaces S1 and S2.

First, each stage 22 is moved to a delivery position in the transfer space T at the lower side, and lift pins 26 (which will be described later) provided in each stage 22 are raised to lift the wafers W. Subsequently, the rotation arm 3 is rotated clockwise by about 30 degrees to insert respective end effectors 32 between the stages 22 and the wafers W as illustrated in FIG. 4. Subsequently, the lift pins 26 are lowered to place the wafers W on respective end effectors 32. Subsequently, the rotation arm 3 is rotated clockwise by 180 degrees to transfer the wafers W to holding positions on respective stages 22. When each stage 22 raises the lift pins 26 to receive the wafer W, the rotation arm 3 is rotated counterclockwise by about 30 degrees to move to the standby position. In this way, the wafers W may be transferred by the rotation arm 3 such that the wafers W in the first column and the wafers W in the second column are replaced with each other. Therefore, for example, when different processes are repeated in the processing spaces S1 and S2 and the processing spaces S3 and S4 (e.g., when a film forming process and an annealing process are repeated), the time required for the transfer of the wafers W may be reduced.

Figure 5:
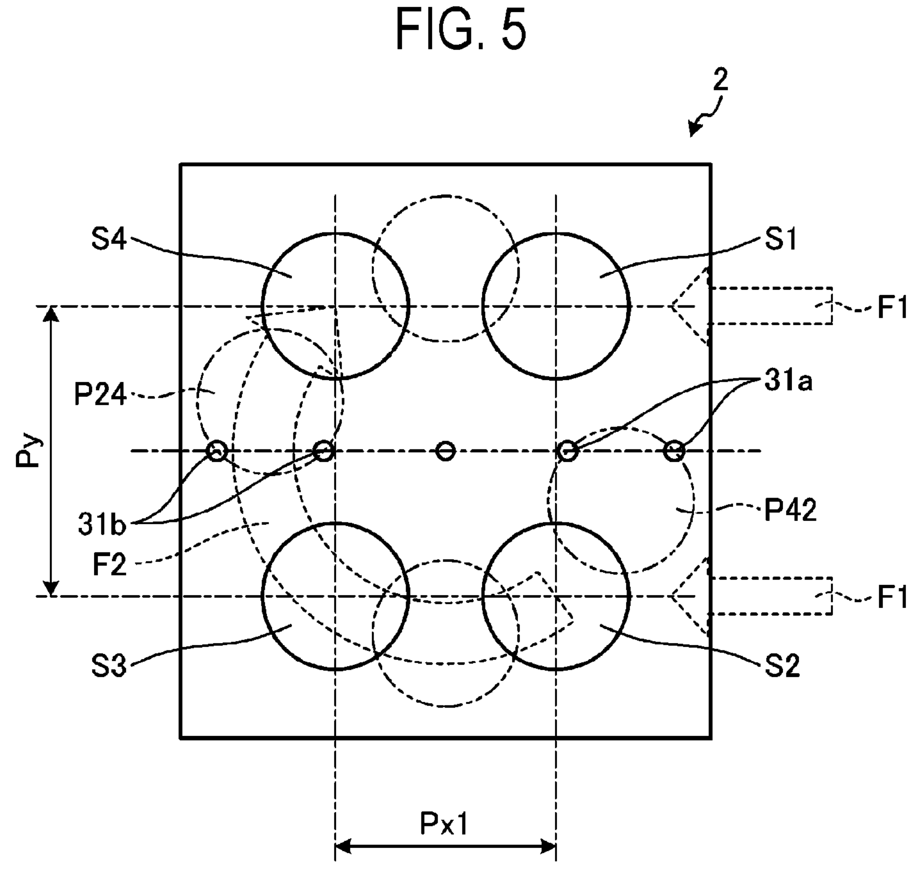
FIG. 5 is a view illustrating an example of movement paths of wafers in the substrate processing apparatus according to the embodiment.

FIG. 5 is a view illustrating an example of movement paths of wafers in the substrate processing apparatus according to the present embodiment. FIG. 5 illustrates the movement path when the wafers W are loaded into the substrate processing apparatus 2 from the vacuum transfer chamber 14*a*. First, as illustrated by paths F1, two wafers W are simultaneously loaded onto respective stages 22 by the transfer arm 15*a* of the vacuum transfer chamber 14*a* at the delivery positions in the transfer space T below the processing spaces S1 and S2 corresponding to the stages 22 in the same column. The respective stages 22 of the processing spaces S1 and S2 raise the lift pins 26 to receive the wafers W.

Subsequently, the rotation arm 3 is rotated clockwise from the standby position by about 30 degrees, the end effectors 32 are inserted between the stages 22 located at the delivery positions below the processing spaces S1 and S2 and the wafers W, and the lift pins 26 are lowered to place the wafers W on the respective end effectors 32. When the wafers W are placed, the rotation arm 3 is rotated clockwise by 180 degrees as illustrated by a path F2 to transfer the wafers W onto the stages 22 located at the delivery positions (the holing positions of the rotation arm 3) in the transfer space T below the processing spaces S3 and S4. When the stages 22 located at the delivery positions below the processing spaces S3 and S4 raise the lift pins 26 to receive the wafers W, respectively, the rotation arm 3 is rotated counterclockwise by about 30 degrees to move to the standby position. In this state, the wafers W are not placed on the stages 22 of the processing spaces S1 and S2, and the wafers W are placed on the stages 22 of the processing spaces S3 and S4. Subsequently, as indicated by the paths F1, the two wafers W are simultaneously loaded onto respective stages 22 at the delivery positions below the processing spaces S1 and S2, by the transfer arm 15*a* of the vacuum transfer chamber 14*a*. Then, by placing the wafers W on the stages 22 of the processing spaces S1 and S2, the wafers W are placed on all the stages 22 of the processing spaces S1 to S4.

Similarly, during unloading, the wafers W placed on the stages 22 located at the delivery positions below the processing spaces S1 and S2 are first unloaded to the vacuum transfer chamber 14*a* by the transfer arm 15*a*. Subsequently, the wafers W placed on the stages 22 located at the delivery positions below the processing spaces S3 and S4 are transferred by the rotation arm 3 to the stages 22 located at the delivery positions below the processing spaces S1 and S2. Subsequently, the wafers W placed on the stages 22 located at the delivery positions below the processing spaces S1 and S2 are unloaded to the vacuum transfer chamber 14*a* by the transfer arm 15*a*. In this way, by using the transfer arm 15*a* capable of simultaneously loading or unloading the two wafers W and the rotation arm 3, the wafers W may be loaded into and unloaded from the processing spaces S1 to S4.

In addition, the substrate processing apparatus 2 may include position detection sensors that detect the positions of the wafers W at respective positions on the rotation trajectory of the wafers W held by the rotation arm 3. The positions are rotationally symmetrical to each other within the row interval or the column interval. In the example of FIG. 5, the substrate processing apparatus 2 includes sensors 31*a* and 31*b*, which are position detection sensors, in each of a space between the processing spaces S1 and S2 and a space between the processing spaces S3 and S4, which are within the row interval.

Each of the sensors 31*a* and the sensors 31*b* is, for example, a set of two optical sensors, which are arranged on a straight line in the X direction that passes through the center of the substrate processing apparatus 2, that is, the center positions of the two-row and two-column layout. This is to reduce an error by setting the direction of thermal expansion of the processing container 20 to be the same for the two sensors. The arrangement positions of the sensors 31*a* and 31*b* are not limited to the X direction as long as the positions are on a straight line passing through the center of the substrate processing apparatus 2. The substrate processing apparatus 2 detects the positions of the wafers W by comparing the front and rear edges of the wafers W detected by the sensors 31*a* and 31*b* with output results of encoders (not illustrated) provided in the rotation arm 3.

In the example of FIG. 5, the position P24 represents the state in which the rear edge of a wafer W passes through the sensors 31*b* when the wafer W is transferred from the processing space S2 to the processing space S4, and the position P42 represents the state in which the rear edge of the wafer W passes through the sensors 31*a* when the wafer W is transferred from the processing space S4 to the processing space S2. The sensors 31*a* and 31*b* are capable of detecting, for example, the center positions of the wafers W that have passed therethrough. The sensors 31*a* and 31*b* output detection results indicating the positions of the wafers W to the controller 8.

Figure 6:
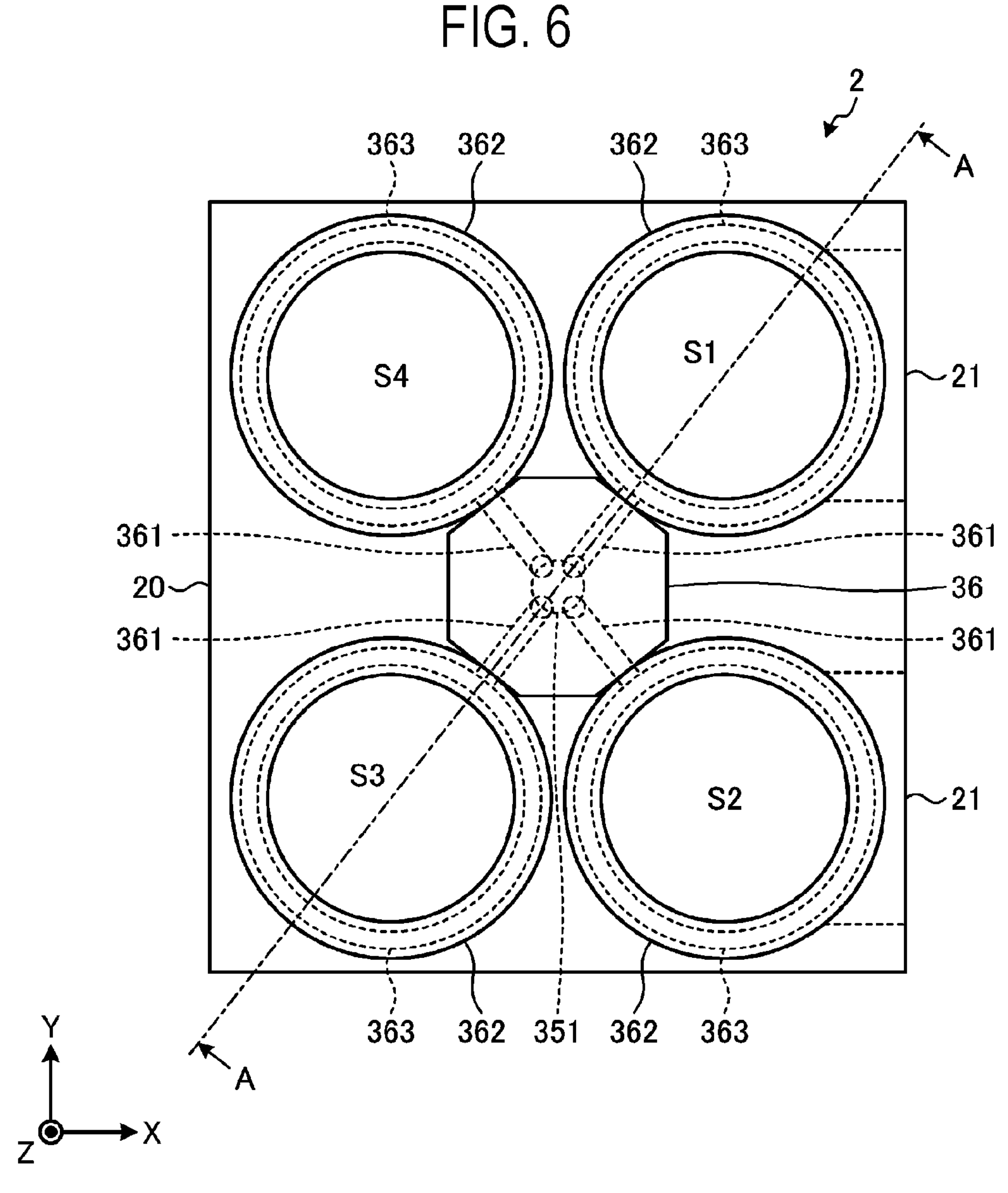
FIG. 6 is a view illustrating an example of exhaust paths of the substrate processing apparatus according to the embodiment.

FIG. 6 is a view illustrating an example of exhaust paths of the substrate processing apparatus according to the present embodiment. FIG. 6 illustrates a case in which the processing container 20 is viewed from above in the state in which the gas supplier 4 to be described later is removed. As illustrated in FIG. 6, a manifold 36 is arranged in the center of the substrate processing apparatus 2. The manifold 36 includes a plurality of exhaust paths 361, which are connected to the processing spaces S1 to S4, respectively. Each exhaust path 361 is connected to a hole 351 in a thrust nut 35, which will be described later, below the center of the manifold 36. Each exhaust path 361 is connected to an annular flow path 363 in each of guide members 362 provided above the processing spaces S1 to S4. That is, the gas in the processing spaces S1 to S4 is exhausted to a junction exhaust port 205, which will be described later, via the flow paths 363, the exhaust paths 361, and the hole 351.

Figure 7:
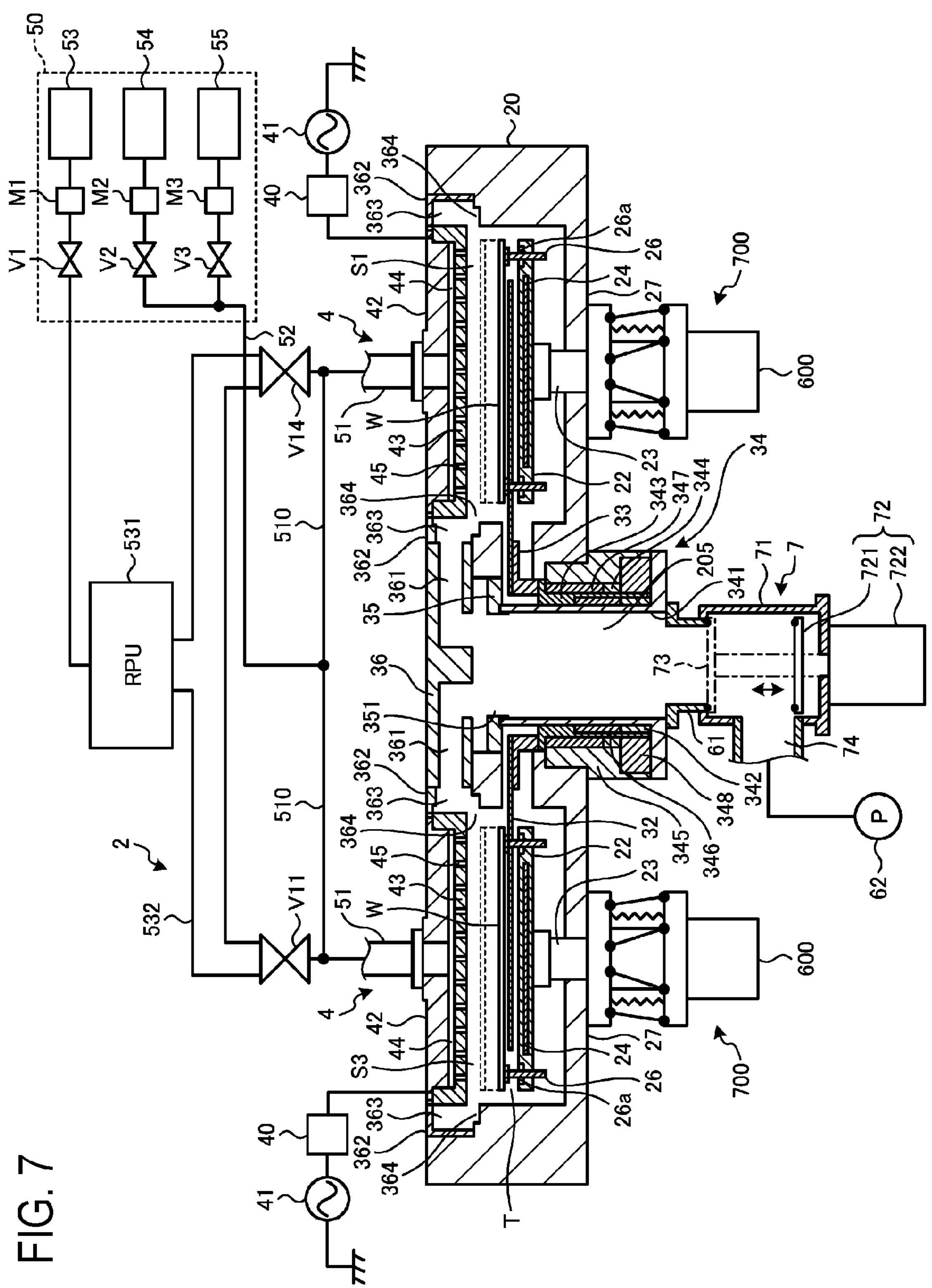
FIG. 7 is a schematic cross-sectional view illustrating an example of the configuration of the substrate processing apparatus according to the embodiment.

FIG. 7 is a schematic cross-sectional view illustrating an example of a configuration of the substrate processing apparatus according to the present embodiment. The cross section of FIG. 7 corresponds to the cross section of the substrate processing apparatus 2 taken along line A-A in FIG. 6. The four processing spaces S1 to S4 are configured in the same manner as one another and are provided between the stages 22, on each of which the wafer W is placed, and gas suppliers 4 disposed to face the stages 22, respectively. In other words, in the processing container 20, each of the four processing spaces S1 to S4 is provided with a stage 22 and a gas supplier 4. FIG. 7 illustrates the processing spaces S1 and S3. Hereinafter, the processing space S1 will be described as an example.

The stage 22 also serves as a lower electrode, and is formed in a flat cylindrical shape made of, for example, a metal or aluminum nitride (AlN) in which a metal mesh electrode is embedded. The stage 22 is supported by a support member 23 from the bottom side. The support member 23 is formed in a cylindrical shape, extends vertically downwards, and penetrates the bottom 27 of the processing container 20. A lower end portion of the support member 23 is located outside the processing container 20 and connected to the rotational driving mechanism 600. The support member 23 is rotated by the rotational driving mechanism 600. The stage is configured to be capable of rotating with the rotation of the support member 23. An adjustment mechanism 700 is provided in the lower end portion of the support member 23 to adjust the position and inclination of the stage 22.

The stage 22 is configured to be capable of being raised and lowered between a processing position and a delivery position via the support member 23 by the adjustment mechanism 700. In FIG. 7, the solid lines indicate the stages 22 located at the delivery positions, and the broken lines indicate the stages 22 located at the processing positions. In addition, at the delivery positions, the end effectors 32 of the rotation arm 3 are inserted between the stages 22 and the wafers W and receive the wafers W from the lift pins 26. The processing positions are positions when substrate processing (e.g., film formation) is executed, and the delivery positions are positions at which the wafers W are delivered to and from the transfer arm 15*a* or the rotation arm 3 (the end effectors 32).

Heaters 24 are embedded in the stages 22, respectively. The heaters 24 heat respective wafers W placed on the stages 22 to, for example, about 60 degrees C. to 600 degrees C. In addition, the stages 22 are connected to a ground potential.

In addition, each of the stages 22 is provided with a plurality of (e.g., three) pin through-holes 26*a*, and the lift pins 26 are arranged inside these pin through-holes 26*a*, respectively. The pin through-holes 26*a* are provided to penetrate the stages 22 from the placement surfaces (top surfaces) of the stages 22 to the rear surfaces (bottom surfaces) opposite to the placement surfaces. The lift pins 26 are slidably inserted into the pin through-holes 26*a*, respectively. The upper ends of the lift pins 26 are suspended at the side of the placement surfaces of the pin through-holes 26*a*. That is, upper ends of the lift pins 26 have a diameter larger than that of the pin through-holes 26*a*, and recesses having a diameter and a thickness larger than those of the upper ends of the lift pins 26 are formed at the upper ends of the pin through-holes 26*a* to be capable of accommodating the upper ends of the lift pins 26, respectively. As a result, the upper ends of the lift pins 26 are engaged with the stages 22 and suspended from the side of the placement surfaces of the pin through-holes 26*a*. In addition, the lower ends of the lift pins 26 protrude from the rear surfaces of the stages 22 toward the bottom 27 of the processing container 20 to be capable of coming into contact with a lifting mechanism (not illustrated).

In the state in which the stages 22 are raised to the processing positions, the upper ends of the lift pins 26 are received in the recesses at the side of the placement surfaces of the pin through-holes 26*a*, respectively. In this state, when the stages 22 are lowered to the delivery positions and the lift pins 26 are raised by the lifting mechanism (not illustrated), the upper ends of the lift pins 26 protrude from the placement surfaces of the stages 22, as illustrated in FIG. 7.

The gas suppliers 4 are provided in the ceiling of the processing container 20 and above the stages 22 via guide members 362 made of an insulating member. The gas suppliers 4 have a function as an upper electrode. Each of the gas suppliers 4 includes a lid 42, a shower plate 43 forming a facing surface provided to face the placement surface of the stage 22, and a gas flow chamber 44 formed between the lid 42 and the shower plate 43. A gas supply pipe 51 is connected to the lid 42, and gas ejection holes 45 penetrating the shower plate 43 in the thickness direction are arranged vertically and horizontally in the shower plate 43 such that the gas is ejected toward the stage 22 in the form of a shower.

The gas suppliers 4 are connected to a gas supply system 50 via the gas supply pipes 51. The gas supply system 50 includes, for example, a source of a reaction gas (a film forming gas) which is a processing gas, a purge gas, and a cleaning gas, a pipe, a valve V, a flow rate adjuster M, or the like. The gas supply system 50 includes, for example, a cleaning gas source 53, a reaction gas source 54, a purge gas source 55, valves V1 to V3 provided in the pipes of respective gas sources, and flow rate adjusters M1 to M3.

The cleaning gas source 53 is connected to the cleaning gas supply paths 532 via the flow rate adjuster M1, the valve V1, and a remote plasma unit (RPU) 531. The cleaning gas supply path 532 are branched into four systems at the downstream side of the RPU 531, and the branched paths are connected to the gas supply pipes 51, respectively. Valves V11 to V14 are provided for respective branched pipes at the downstream side of the RPU 531, and the corresponding valves V11 to V14 are opened during cleaning. For the sake of convenience in illustration, only the valves V11 and V14 are illustrated in FIG. 7.

The reaction gas source 54 and the purge gas source 55 are connected to the gas supply paths 52 via the flow rate adjusters M2 and M3 and the valves V2 and V3, respectively. The gas supply path 52 is connected to the gas supply pipes 51 via the gas supply pipes 510. In FIG. 7, the gas supply path 52 and the gas supply pipes 510 collectively illustrate respective supply paths and respective supply pipes corresponding to respective gas suppliers 4.

Radio-frequency power supplies 41 are connected to the shower plates 43 via matchers 40, respectively. The shower plates 43 have a function as upper electrodes facing the stages 22. When radio-frequency power is applied between the shower plates 43, which are the upper electrodes, and the stages 22, which are the lower electrodes, it is possible to plasmarize a gas supplied from the shower plates 43 to the processing spaces S1 (a reaction gas in this example) through capacitive coupling.

Next, the exhaust paths from the processing spaces S1 to S4 to the junction exhaust port 205 will be described. As illustrated in FIGS. 6 and 7, the exhaust paths pass through respective exhaust paths 361 from the annular flow paths 363 in respective guide members 362 provided above the processing spaces S1 to S4 and are directed to the junction exhaust port 205 via the junction portion and the hole 351 below the center of the manifold 36. The exhaust paths 361 have, for example, a circular cross section.

Around each of the processing spaces S1 to S4, a guide member 362 for exhaust is provided to surround each of the processing spaces S1 to S4. The guide member 362 is, for example, an annular body, which is provided to surround the region around the corresponding stage 22 located at the processing position with an interval from the stage 22. The guide member 362 is configured to form therein a flow path 363 having, for example, a rectangular vertical cross section and an annular shape in a plan view. FIG. 6 schematically illustrates the processing spaces S1 to S4, the guide members 362, the exhaust paths 361, and the manifold 36.

The guide members 362 form slit-shaped slit exhaust ports 364, which are open toward the processing spaces S1 to S4, respectively. In this way, the slit exhaust ports 364 are arranged in the side peripheral portions of respective processing spaces S1 to S4 along the circumferential direction. The exhaust paths 361 are connected to the flow paths 363 and allow the processing gas exhausted from the slit exhaust ports 364 to flow toward the junction portion and the hole 351 below the center of the manifold 36.

As illustrated in FIG. 6, the set of processing spaces S1 and S2 and the set of processing spaces S3 and S4 are arranged rotationally symmetrically by 180 degrees around the manifold 36 when viewed from the top side. As a result, processing gas flow paths, which extend from respective processing spaces S1 to S4 to the hole 351 via the slit exhaust ports 364, the flow paths 363 in the guide members 362, and the exhaust paths 361, surround the hole 351 and are arranged rotationally symmetrically by 180 degrees.

The hole 351 is connected to the exhaust pipe 61 via the junction exhaust port 205 inside the thrust pipe 341 of a biaxial vacuum seal 34 arranged in a central portion of the processing container 20. The exhaust pipe 61 is connected to a vacuum pump 62 forming a vacuum exhaust mechanism via a valve mechanism 7. One vacuum pump 62 is provided in, for example, one processing container 20, and the exhaust pipes downstream of respective vacuum pumps 62 are joined and are connected to, for example, a factory exhaust system.

The valve mechanism 7 opens/closes the processing gas flow path formed in the exhaust pipe 61 and includes, for example, a casing 71 and an opening/closing section 72. A first opening 73 connected to the exhaust pipe 61 on the upstream side is formed in the top surface of the casing 71, and a second opening 74 connected to the exhaust pipe on the downstream side is formed in the side surface of the casing 71.

The opening/closing section 72 includes, for example, an opening/closing valve 721 having a size that closes the first opening 73, and a lifting mechanism 722 provided outside the casing 71 configured to raise/lower the opening/closing valve 721 inside the casing 71. The opening/closing valve 721 is configured to be raised/lowered between a closing position (indicated by the alternated long and short dash line in FIG. 7) for closing the first opening 73 and an opening position (indicated by the solid line in FIG. 7) retracted to the lower side of the first and second openings 73 and 74. When the opening/closing valve 721 is located at the closing position, the downstream end of the junction exhaust port 205 is closed, and the exhaust of the interior of the processing container 20 is stopped. In addition, when the opening/closing valve 721 is located at the opening position, the downstream end of the junction exhaust port 205 is opened and the interior of the processing container 20 is exhausted.

Next, the biaxial vacuum seal 34 and the thrust nut 35 will be described. The biaxial vacuum seal 34 includes a thrust pipe 341, bearings 342 and 344, a rotor 343, a main body 345, magnetic fluid seals 346 and 347, and a direct drive motor 348.

The thrust pipe 341 is a non-rotating central shaft and receives a thrust load applied to an upper center of the substrate processing apparatus 2 via the thrust nut 35. That is, the thrust pipe 341 receives a vacuum load applied to a central portion of the substrate processing apparatus 2 when a vacuum atmosphere is created in the processing spaces S1 to S4, thereby suppressing the deformation of the upper portion of the substrate processing apparatus 2. The thrust pipe 341 has a hollow structure, and the interior of the thrust pipe 341 forms the junction exhaust port 205. The top surface of the thrust pipe 341 is in contact with the bottom surface of the thrust nut 35. A space between the inner surface of the upper portion of the thrust pipe 341 and the outer surface of a convex portion at the inner peripheral side of the thrust nut 35 is sealed by an O-ring (not illustrated).

An outer peripheral-side surface of the thrust nut 35 has a screw structure, and the thrust nut 35 is screwed to a partition wall in a central portion of the processing container 20. The manifold 36 is provided above the central portion of the processing container 20. The manifold 36, the partition wall in the central portion of the processing container 20, the thrust nut 35, and the thrust pipe 341 receive the thrust load.

The bearing 342 is a radial bearing that holds the rotor 343 at the side of the thrust pipe 341. The bearing 344 is a radial bearing that holds the rotor 343 at the side of the main body 345. The rotor 343 is arranged concentrically with the thrust pipe 341 and is a rotation shaft in the center of the rotation arm 3. In addition, the base member 33 is connected to the rotor 343. When the rotor 343 rotates, the rotation arm 3, that is, the end effectors 32 and the base member 33 rotate.

The main body 345 accommodates therein the bearings 342 and 344, the rotor 343, the magnetic fluid seals 346 and 347, and the direct drive motor 348. The magnetic fluid seals 346 and 347 are arranged at an inner periphery side and an outer periphery side of the rotor 343 to seal the processing spaces S1 to S4 with respect to the outside. The direct drive motor 348 is connected to the rotor 343 and drives the rotor 343, thereby rotating the rotation arm 3.

In this way, in the biaxial vacuum seal 34, the thrust pipe 341, which is the non-rotating central shaft of the first axis, serves as a gas exhaust pipe while supporting the load of the upper portion of the processing container 20, and the rotor 343 of the second axis serves to rotate the rotation arm 3.

[Method of Measuring Positional Deviation of Stage]

Figure 8:
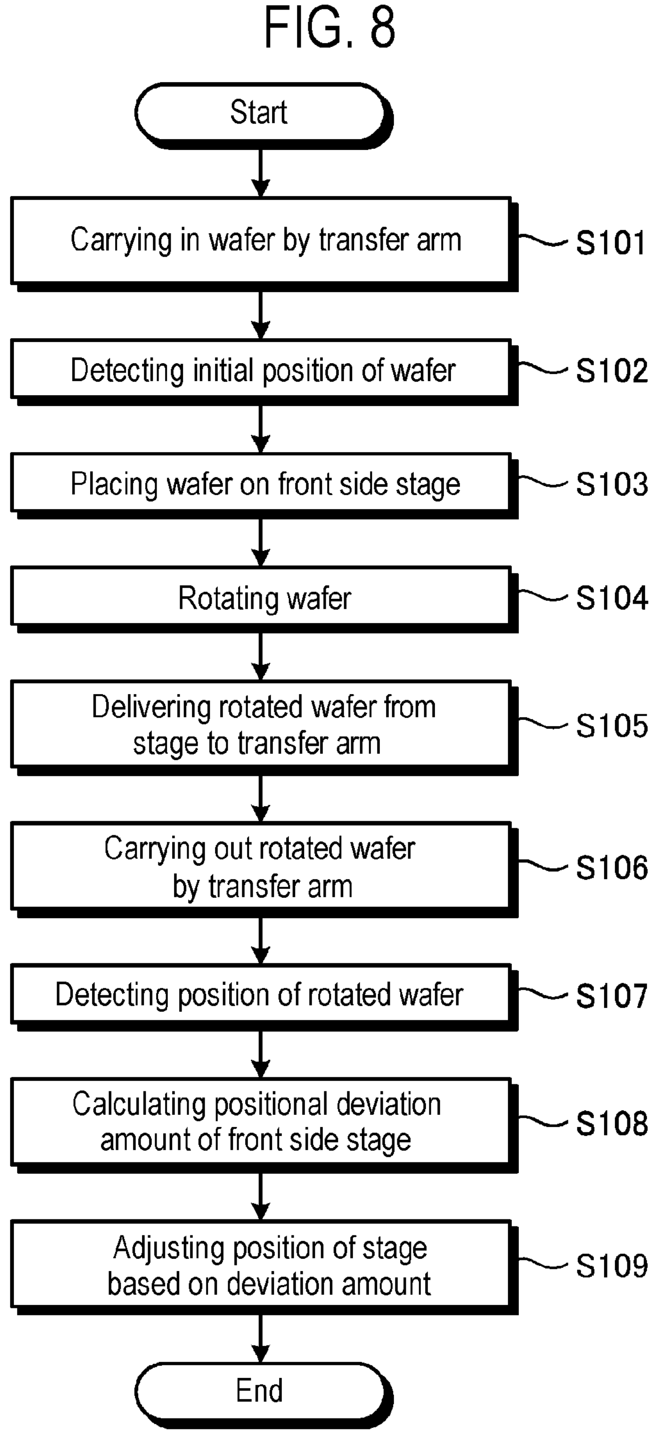
FIG. 8 is a flowchart illustrating an example of a process of measuring a positional deviation of a stage according to an embodiment.

Next, a method of measuring a positional deviation of the stage 22 in the substrate processing apparatus 2 according to an embodiment will be described. FIG. 8 is a flowchart illustrating an example of a process of measuring a positional deviation of the stage 22 according to the present embodiment. A case of measuring a deviation amount for each stage 22 (hereinafter, properly referred to as a "front-side stage 22") in the processing spaces S1 and S2 located on the front side with respect to the vacuum transfer chamber 14*a* will be described with reference to FIG. 8. A series of processes including adjustment of the positions of the stages 22 based on a measured deviation amount will be described with reference to FIG. 8. Various processes illustrated in FIG. 8 are executed under the control of the controller 8.

The controller 8 carries the wafers W into the processing container 20 by the transfer arm 15*a* from the vacuum transfer chamber 14*a* (step S101).

When the wafers W are loaded into the processing container 20 from the vacuum transfer chamber 14*a* through the loading/unloading ports 21, the controller 8 detects initial positions of the wafers W transferred by the transfer arm 15*a* by using the sensors 17 (step S102). In step S102, for example, the controller 8 detects initial positions of the centers of the wafers W.

When the wafers W loaded into the processing container reach delivery positions corresponding to the front-side stages 22 in the transfer space T below the processing spaces S1 and S2, the controller 8 operates the lift pins 26 to place the wafers W on the front-side stages 22 (step S103). When the wafers W are placed on the front-side stages 22, the controller 8 rotates the wafers W by a predetermined rotational angle α by rotating the stages 22 (step S104).

After the rotation of the wafers W is completed, the controller 8 operates the lift pins 26 to deliver the wafers W after rotation from the stages 22 to the transfer arms 15*a* (step S105). The controller 8 unloads the wafers W after rotation from the processing container 20 to the vacuum transfer chamber 14*a* by the transfer arm 15*a* (step S106).

When the wafers W after rotation are unloaded from the processing container 20 to the vacuum transfer chamber 14*a* via the loading/unloading ports 21, the controller 8 detects the positions of the wafers W after rotation, which are transferred by the transfer arm 15*a*, by using the sensors 17 (step S107). In step S107, for example, the controller 8 detects the center positions of the wafers W after rotation.

The controller 8 calculates positional deviation amounts of the stages 22 with respect to the initial positions of the wafers W based on the initial positions of the wafers W detected in step S102, and the positions of the wafers W after rotation and the rotational angle α detected in step S107 (step S108). In step S108, for example, the controller 8 calculates the deviation amounts of the center positions of the stages 22 with respect to the initial positions of the centers of the wafers W based on the initial positions of the centers of the wafers W, the center positions of the wafers W after rotation, and the rotational angle α.

Figure 9:
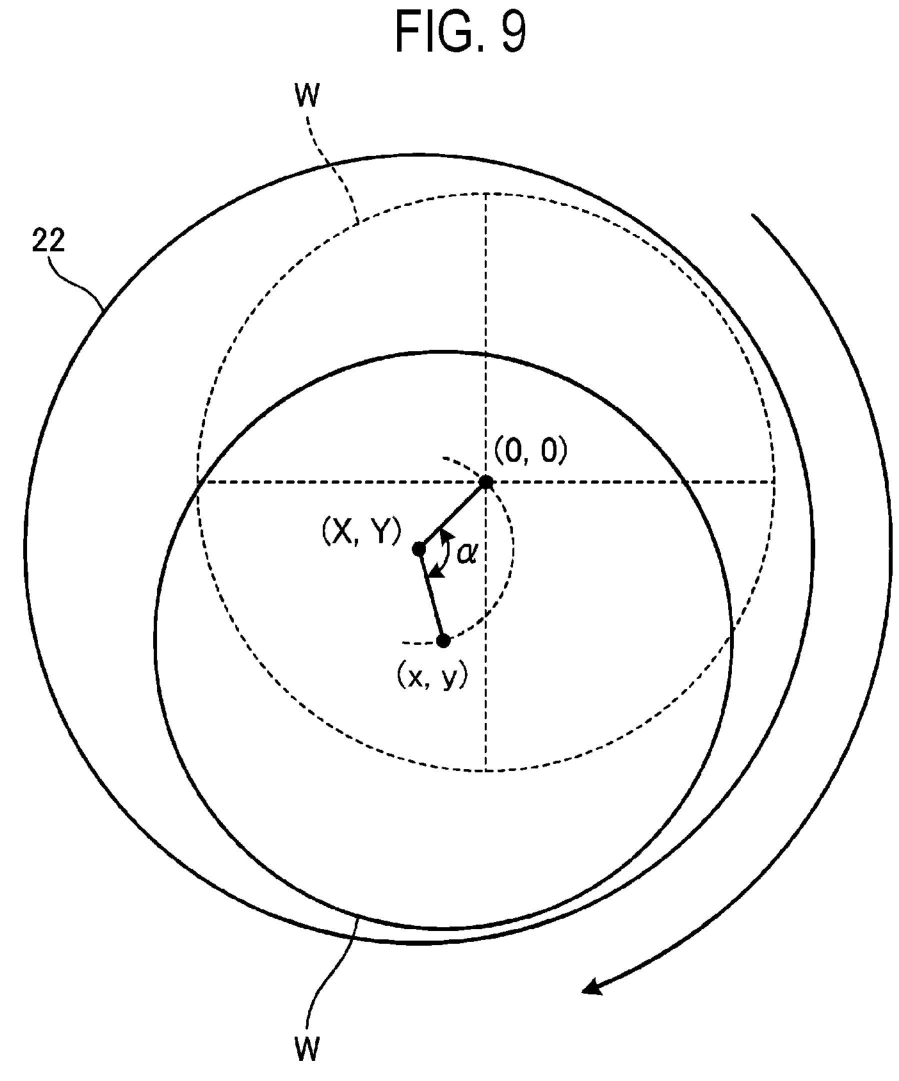
FIG. 9 is a view illustrating an example of a deviation amount of a center position of a stage with respect to an initial position of a center of a wafer according to an embodiment.

FIG. 9 is a view illustrating an example of a deviation amount of the center position of a stage 22 with respect to the initial position of the center of the wafer W according to the present embodiment. In FIG. 9, the wafer W before rotation, which is located at the initial position on the stage 22, is indicated by a broken line, and the wafer W rotated by the rotational angle α with the rotation of the stage 22 is indicated by a solid line. When the center of the wafer W before rotation is represented as a reference position (0, 0) and the coordinates of the center of the wafers W after rotation are represented as (x, y), the coordinates (X, Y) of the center of the stage 22 may be obtained from the following Equations 1 and 2. That is, the deviation amount of the center position of the stage 22 from the initial position of the center of the wafer W is calculated as coordinates (X, Y).

[Equation 1]

$$X = \frac{\sqrt{x^2 + y^2}}{2\sin\left(90 - \frac{\alpha}{2}\right)}\cos\left(\alpha - \tan^{-1}\left(\frac{y}{x}\right)\right) \quad (1)$$

[Equation 2]

$$Y = \frac{\sqrt{x^2 + y^2}}{2\sin\left(90 - \frac{\alpha}{2}\right)}\sin\left(\alpha - \tan^{-1}\left(\frac{y}{x}\right)\right) \quad (2)$$

The method of calculating the deviation amount by the controller 8 is not limited to the method illustrated in FIG. 9. For example, the controller 8 may calculate a deviation amount of an edge position of the stage 22 with respect to the initial position of the edge of the wafer W based on the initial position of the edge of the wafer W, the position of the edge of the wafer W after rotation, and the rotational angle α.

Returning to the description of FIG. 8, the controller 8 adjusts the positions of the stages 22 based on the calculated deviation amounts, that is, the deviation amounts of the center positions of the stages 22 with respect to the initial positions of the centers of the wafers W (step S109). In step S109, for example, the controller 8 controls the adjustment mechanism 700 to move the front-side stages 22 so that the deviation amounts are canceled.

In the example of FIG. 8, the controller 8 adjusts the positions of the stages 22 based on the calculated deviation amounts, but the present disclosure is not limited thereto. The controller 8 may adjust the transfer positions of the wafers W by the transfer arm 15*a* based on the calculated deviation amounts. In such a case, the controller 8 moves the substrate holders of the transfer arm 15*a* so that the deviation amounts are cancelled.

Figure 10:
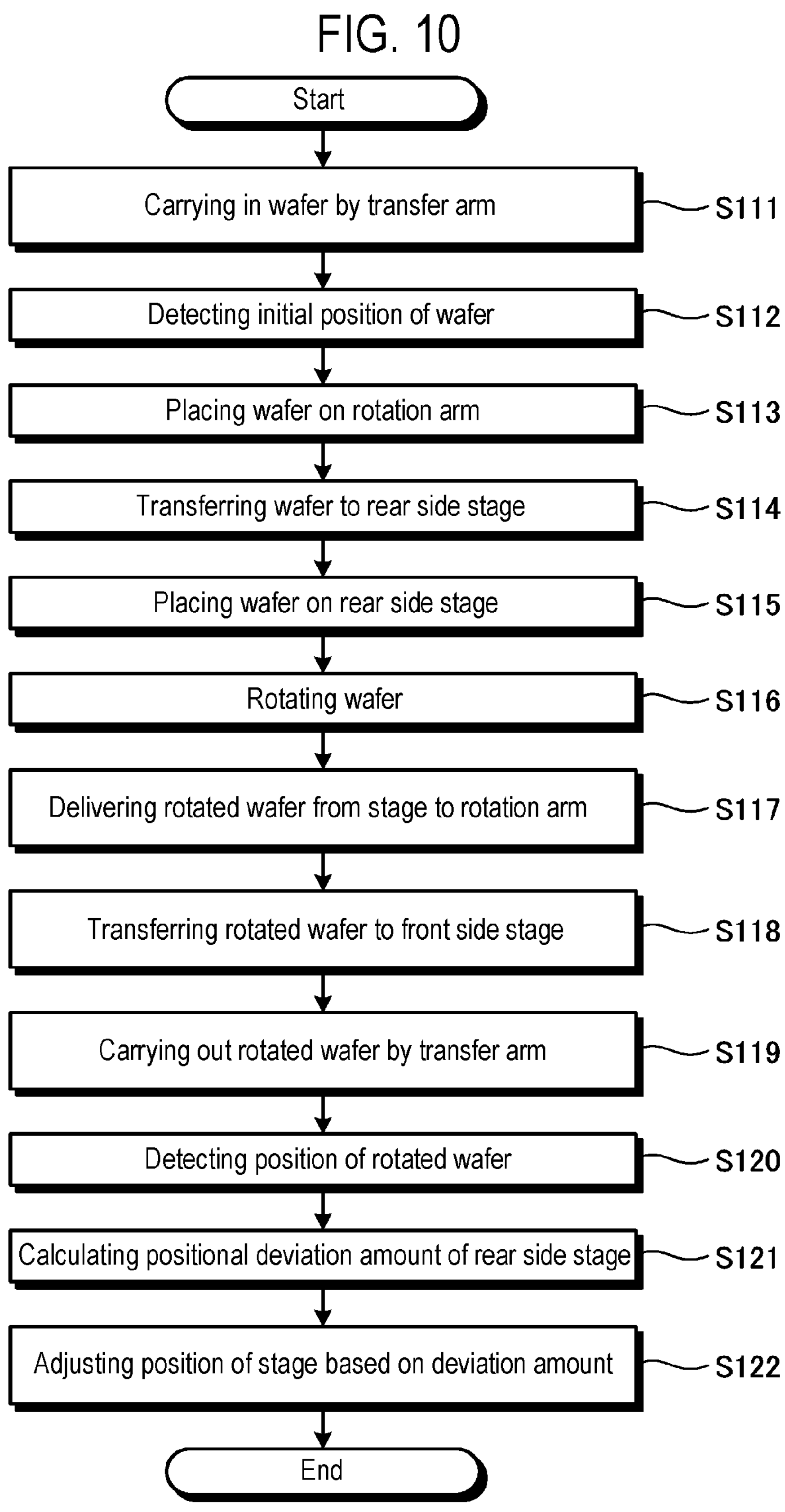
FIG. 10 is a flowchart illustrating another example of the process of measuring the positional deviation of the stage according to an embodiment.

FIG. 10 is a flowchart illustrating another example of the process of measuring a positional deviation of the stage 22 according to the present embodiment. A case where a deviation amount is measured for each stage 22 (hereinafter, properly referred to as a "rear-side stage 22") in the processing spaces S3 and S4 located at the rear side with respect to the vacuum transfer chamber 14*a* will be described with reference to FIG. 10. A series of processes including adjustment of the positions of the stages 22 based on a measured deviation amount will be described with reference to FIG. 10. Various processes illustrated in FIG. 10 are executed under the control of the controller 8.

The controller 8 loads the wafers W into the processing container 20 by the transfer arm 15*a* from the vacuum transfer chamber 14*a* (step S111).

When the wafers W are loaded into the processing container 20 from the vacuum transfer chamber 14*a* through the loading/unloading ports 21, the controller 8 detects the initial positions of the wafers W transferred by the transfer arm 15*a* by using the sensors 17 (step S112). In step S112, for example, the controller 8 detects the initial positions of the centers of the wafers W.

When the wafers W loaded into the processing container reach the delivery positions corresponding to the front-side stages 22 in the transfer space T below the processing spaces S1 and S2, the controller 8 places the wafers W on the rotation arm 3 (step S113). In step S113, for example, the controller 8 raises the lift pins 26 from the front-side stages 22 to receive the wafers W by the lift pins 26. Then, the controller 8 rotates the rotation arm 3 clockwise by about 30 degrees from the standby positions, and inserts the end effectors 32 into the spaces between the wafers W and the stages 22 located at the delivery positions below the processing spaces S1 and S2. Then, the controller 8 lowers the lift pins 26 to place the wafers W on the end effectors 32.

When the wafers W are placed on the rotation arm 3, the controller 8 rotates the rotation arm 3 clockwise by 180 degrees to transfer the wafers W to the rear-side stages 22 located at the delivery positions in the transfer space T below the processing spaces S3 and S4 (step S114).

When the wafers W placed on the rotation arm 3 reach the delivery positions corresponding to the rear-side stages 22 in the transfer space T below the processing spaces S3 and S4, the controller 8 operates the lift pins 26 to place the wafers W on the rear-side stages 22 (step S115). When the wafers W are placed on the rear-side stages 22, the controller 8 rotates the wafers W by a predetermined rotational angle α by rotating the stages 22 (step S116).

After the rotation of the wafers W is completed, the controller 8 operates the lift pins 26 to deliver the wafers W after rotation from the stages 22 to the rotation arm 3 (step S117).

When the wafers W after rotation are delivered to the rotation arm 3, the controller 8 rotates the rotation arm 3 clockwise by 180 degrees to transfer the wafers W after rotation to the front-side stages 22 located at the delivery positions in the transfer space T below the processing spaces S1 and S2 (step S118).

When the wafers W after rotation reach the delivery positions in the transfer space T below the processing spaces S1 and S2 corresponding to the front-side stages 22, the controller 8 operates the lift pins 26 to deliver the wafers W after rotation from the rotation arm 3 to the transfer arm 15*a*. The controller 8 carries out the wafers W after rotation from the processing container 20 to the vacuum transfer chamber 14*a* by the transfer arm 15*a* (step S119).

When the wafers W after rotation are unloaded from the processing container 20 to the vacuum transfer chamber 14*a* through the loading/unloading ports 21, the controller 8 detects the positions of the wafers W after rotation, which are transferred by the transfer arm 15*a*, by using the sensors 17 (step S120). In step S120, for example, the controller 8 detects the center positions of the wafers W after rotation.

The controller 8 calculates the positional deviation amounts of the stages 22 with respect to the initial positions of the wafers W based on the initial positions of the wafers W detected in step S112, and the positions of the wafers W after rotation and the rotational angle α detected in step S120 (step S121). In step S121, for example, the controller 8 calculates the deviation amounts of the center positions of the stages 22 with respect to the initial positions of the centers of the wafers W based on the initial positions of the centers of the wafers W, the center positions of the wafers W after rotation, and the rotational angle α. The method of calculating the deviation amounts in step S121 is fundamentally the same as the method illustrated in FIG. 9. However, since the rear-side stages 22 and the front-side stages 22 have a 180-degree rotational symmetry, the positive and negative of the coordinates (x, y) of the centers of the wafers W after rotation are reversed.

The controller 8 adjusts the positions of the stages 22 based on the calculated deviation amounts, that is, the positional deviation amounts of the stages 22 with respect to the initial positions of the wafers W (step S122). In step S122, for example, the controller 8 controls the adjustment mechanism 700 to move the front-side stages 22 so that the deviation amounts are canceled.

As described above, in the substrate processing apparatus 2, the relative positional deviation amount between the stages 22 and the wafers W may be measured based on the initial positions of the wafers W before rotation, and the positions and the rotational angle of the wafers W after rotation. That is, a relative positional deviation amount between the stages 22 and the wafers W may be simply and quickly measured without visually confirming the relative positional deviation amount between the stages 22 and the wafers W. In addition, in the substrate processing apparatus 2, the positions of the stages 22 may be adjusted without exposing the processing container 20 to the air atmosphere.

[Modifications]

In the above-described embodiment, the case where the sensors 17 provided in the vacuum transfer chamber 14*a* are used to detect initial positions of the wafers W and positions of rotated wafers W has been described as an example, but the sensors 31*a* and 31*b* provided in the substrate processing apparatus 2 may be used. A case in which the sensors 31*a* and 31*b* are used to detect initial positions of the wafers W and positions of rotated wafers W will be described as a modification.

Figure 11:
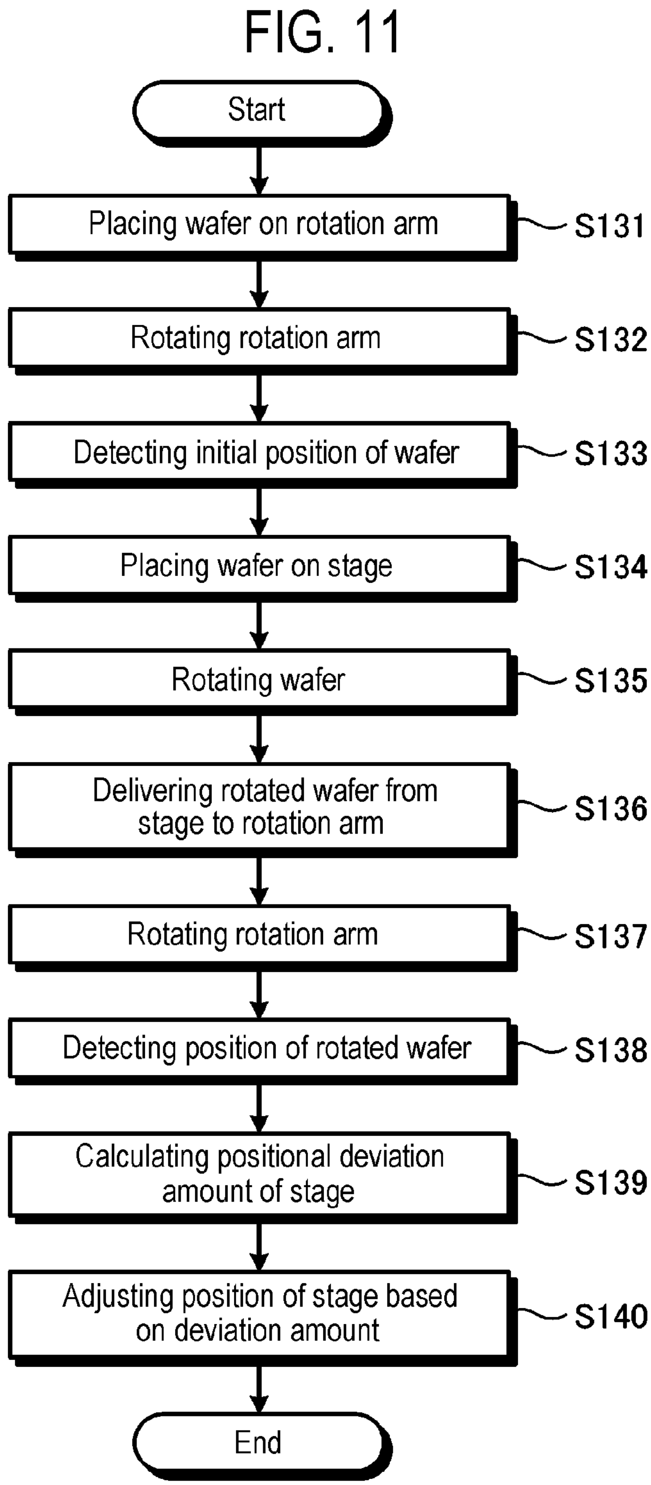
FIG. 11 is a flowchart illustrating an example of a process of measuring a positional deviation of a stage according to a modification.

FIG. 11 is a flowchart illustrating an example of a process of measuring a positional deviation of a stage 22 according to the modification. In FIG. 11, a case where deviation amounts are collectively measured for all stages 22 in the processing spaces S1 to S4 is explained. A series of processes including adjustment of the positions of the stages 22 based on the measured deviation amounts will be described with reference to FIG. 11. Various processes illustrated in FIG. 11 are executed under the control of the controller 8. In addition, the various processes illustrated in FIG. 11 are initiated after the wafers W are placed on all the stages 22 in the processing spaces S1 to S4.

The controller 8 places the wafers Won the rotation arm (step S131). In step S131, for example, the controller 8 raises the lift pins 26 from the stages 22 to receive the wafers W by the lift pins 26. Then, the controller 8 rotates the rotation arm 3 clockwise by about 30 degrees from the standby positions to insert the end effectors 32 into the spaces between the wafers W and the stages 22 located at the delivery positions below the processing spaces S1 to S4. Then, the controller 8 lowers the lift pins 26 to place the wafers W on the end effectors 32.

When the wafers W are placed on the rotation arm 3, the controller 8 rotates the rotation arm 3 clockwise by 180 degrees to transfer the wafers W on the rotation arm 3 to pass through the sensors 31*a* and 31*b* (step S132).

The controller 8 detects the initial positions of the wafers W by using the sensors 31*a* and 31*b* when the wafers W are transferred by the rotation of the rotation arm 3 (step S133). In step S133, for example, the controller 8 detects the initial positions of the centers of the wafers W. After the transfer of the wafers W by the rotation of the rotation arm 3 is completed, the controller 8 further rotates the rotation arm 3 clockwise by 180 degrees to transfer the wafers W such that the wafers return to the original positions when the wafers W were placed on the rotation arm 3.

When the wafers W return to the original positions when the wafers W were placed on the rotation arm 3, the controller 8 operates the lift pins 26 to place the wafers W on the stages 22 (step S134). When the wafers W are placed on the stages 22, the controller 8 rotates the wafers W by a predetermined rotational angle α by rotating the stages 22 (step S135).

After the rotation of the wafers W is completed, the controller 8 operates the lift pins 26 to deliver the wafers W after rotation from the stages 22 to the rotation arm 3 (step S136).

When the wafers W after rotation are delivered to the rotation arm 3, the controller 8 rotates the rotation arm 3 clockwise by 180 degrees to transfer the wafers W such that the wafers W after rotation on the rotation arm 3 pass through the sensors 31*a* and 31*b* (step S137).

The controller 8 detects the positions of the wafers W after rotation by using the sensors 31*a* and 31*b* when the wafers W after rotation are transferred by the rotation of the rotation arm 3 (step S138). In step S138, for example, the controller 8 detects the center positions of the wafers W after rotation. After the transfer of the wafers W after rotation by the rotation of the rotation arm 3 is completed, the controller 8 further rotates the rotation arm 3 clockwise by 180 degrees to transfer the wafers W after rotation such that the wafers W after rotation return to the original positions thereof when the wafers W after rotation were delivered to the rotation arm 3. The wafers W after rotation, which have returned to the original positions thereof, may be unloaded from the processing container 20 to the vacuum transfer chamber 14*a* by the transfer arm 15*a*.

The controller 8 calculates the positional deviation amounts of the stages 22 with respect to the initial positions of the wafers W based on the initial positions of the wafers W detected in step S133, and the positions of the wafers W after rotation and the rotational angle α detected in step S138 (step S139). In step S139, for example, the controller 8 calculates the deviation amounts of the center positions of the stages 22 with respect to the initial positions of the centers of the wafers W based on the initial positions of the centers of the wafers W, the center positions the wafers W after rotation, and the rotational angle α. The method of calculating the deviation amounts in step S139 is the same as the method illustrated in FIG. 9.

The controller 8 adjusts the positions of the stages 22 based on the calculated deviation amounts, that is, the positional deviation amounts of the stages 22 with respect to the initial positions of the wafers W (step S140). In step S140, for example, the controller 8 controls the adjustment mechanism 700 to move the front-side stages 22 so that the deviation amounts are canceled.

As described above, in the substrate processing apparatus 2 of the modification, as in the substrate processing apparatus 2 of the embodiment, relative positional deviation amounts between the stages 22 and the wafers W may be measured based on the initial positions of the wafers W before rotation and the positions and the rotational angle of the wafers W after rotation. That is, relative positional deviation amounts between the stages 22 and the wafers W may be simply and quickly measured without visually confirming the relative positional deviation amounts between the stages 22 and the wafers W. In addition, in the substrate processing apparatus 2, the positions of the stages 22 may be adjusted without exposing the processing container 20 to the air atmosphere.

[Other Modifications]

In the above-described embodiment, the positions of the stages 22 are adjusted based on the calculated deviation amounts, but the present disclosure is not limited thereto. The controller 8 may adjust the transfer positions of the wafers W by the transfer arm 15*a* based on the calculated deviation amounts. For example, the controller 8 may move the substrate holders of the transfer arm 15*a* so that the deviation amounts are cancelled.

In addition, in the above-described embodiment and modification, the process of measuring the positional deviations of the stages 22 may be performed in the state in which the processing container 20 and the stages 22 are heated. That is, steps S101 to S109 in FIG. 8, steps S111 to S122 in FIG. 10, and steps S131 to S140 in FIG. 11 may be executed in the state in which the processing container 20 and the stages 22 are heated. In this case, in the substrate processing apparatus 2, relative positional deviation amounts between the stages 22 and the wafers W caused by thermal expansion of the processing container 20 and the stages 22 may be measured and corrected.

As described above, a substrate processing apparatus (e.g., the substrate processing apparatus 2) according to the embodiment includes a processing container (e.g., the processing container 20), a rotatable substrate stage (e.g., the stages 22) provided inside the processing container, and a controller (e.g., the controller 8). The controller is configured to control the processing container and the substrate stage to execute: a first operation, a second operation, a third operation, a fourth operation, a fifth operation, and a sixth operation. In the first operation, the initial position of the substrate transferred by an arm (e.g., the transfer arm 15*a*, or the rotation arm 3) that transfers a substrate (e.g., a wafer W) is detected. In the second operation, the substrate is placed on the substrate stage. In the third operation, the substrate is rotated by a predetermined rotational angle (e.g., the rotational angle $\alpha$) by rotating the substrate stage. In the fourth operation, the substrate after rotation is transferred from the substrate stage to the arm. In the fifth operation, the position of the substrate after rotation transferred by the arm is detected. In the sixth operation, a positional deviation amount of the substrate stage with respect to the initial position of the substrate is calculated based on the initial position of the substrate, the position of the substrate after rotation, and the rotational angle. As a result, a relative positional deviation amount between the substrate stage and the substrate can be measured.

In addition, the substrate processing apparatus may be connected to a vacuum transfer chamber (e.g., the vacuum transfer chamber 14*a*) including therein a transfer arm (e.g., the transfer arm 15*a*) configured to transfer the substrate. The arm may be the transfer arm. As a result, in a substrate processing system (e.g., the substrate processing system 1) in which the substrate processing apparatus is connected to the vacuum transfer chamber, the relative positional deviation amount between the substrate stage and the substrate can be measured.

In addition, the vacuum transfer chamber may include a detector (e.g., the sensors 17) configured to detect the position of the substrate transferred by the transfer arm. In the first operation, the initial position of the substrate may be detected by using the detector when the substrate is loaded into the processing container from the vacuum transfer chamber. In the fifth operation, the position of the substrate after rotation may be detected by using the detector when the substrate after rotation is transferred from the processing container to the vacuum transfer chamber. As a result, the relative positional deviation amount between the substrate stage and the substrate can be measured from a result detected by the detector of the vacuum transfer chamber.

In addition, the processing container may include therein a plurality of processing spaces (e.g., the processing spaces S1 to S4), each of which is provided with the substrate stage. The substrate processing apparatus may include a rotation arm (e.g., the rotation arm 3) including a plurality of end effectors (e.g., the end effectors 32) capable of holding the substrate to be placed on the substrate stage of each processing space. The arm may be a rotation arm. As a result, in the substrate processing apparatus in the form of simultaneously processing a plurality of substrates in one processing chamber, the relative positional deviation amounts between the substrate stages and the substrates can be measured.

In addition, the substrate processing apparatus may include a detector (e.g., the sensors 31*a* and 31*b*) configured to detect the position of a substrate at a position on a rotation trajectory of the substrate held by the rotation arm. In the first operation, the initial position of the substrate may be detected by using the detector when the substrate is transferred by the rotation of the rotation arm. In the fifth operation, the position of the substrate after rotation is detected by using the detector when the substrate after rotation is transferred by the rotation of the rotation arm. As a result, the relative positional deviation amount between the substrate stage and the substrate can be measured from a result detected by the detector of the substrate processing apparatus.

In addition, in the first operation, the initial position of the center of the substrate may be detected. In the fifth operation, the center position of the substrate after rotation may be detected. In the sixth operation, a deviation amount of the center position of the substrate stage with respect to the initial position of the center of the substrate may be calculated based on the initial position of the center of the substrate, the center position of the substrate after rotation, and the rotational angle. As a result, the relative positional deviation amount between the center of the substrate stage and the center of the substrate can be measured.

In addition, the controller may execute the processes from the first operation to the sixth operation in the state in which the processing container and the substrate stage are heated. As a result, the relative positional deviation amount between the substrate stage and the substrate caused by thermal expansion of the processing container and the substrate stage can be measured.

In addition, the controller may be configured to control the processing container and the substrate stage to further execute a seventh operation. In the seventh operation, the position of the substrate stage may be adjusted based on the calculated deviation amount. As a result, the position of the substrate stage can be adjusted simply and with high accuracy.

In addition, the controller may be configured to control the processing container and the substrate stage to further execute an eighth operation. In the eighth operation, the transfer position of the substrates by an arm (e.g., the transfer arm 15*a*) may be adjusted based on the calculated deviation amount. As a result, the position of the arm can be adjusted simply and with high accuracy.

As described above, the controller may be configured to control the processing container and the substrate stage to execute the seventh operation or the eighth operation. As a result, correction for canceling an error in the installation position of the substrate stage provided inside the processing container and an error in the substrate transfer position due to thermal expansion of the processing container can be executed fully automatically under the control of the controller without opening the processing container and without requiring manual operations.

It is to be understood that the embodiment disclosed herein is exemplary in all respects and is not restrictive. Indeed, the above-described embodiment may be implemented in various forms. Various types of omissions, replacements, and changes may be made to the above-described embodiment without departing from the scope and spirit of the appended claims.

Regarding the above-described embodiments, the following supplementary notes are further disclosed.

(Supplementary Note 1)

A method of measuring a positional deviation of a substrate stage in a substrate processing apparatus including a substrate provided rotatably inside a processing container, includes: detecting an initial position of the substrate transferred by an arm that transfers the substrate; placing the substrate on the substrate stage; rotating the substrate by a predetermined rotational angle by rotating the substrate stage; delivering the substrate after rotation from the substrate stage to the arm; detecting a position of the substrate after rotation transferred by the arm; and calculating a positional deviation amount of the substrate stage with respect to the initial position of the substrate based on the initial position of the substrate, the position of the substrate after rotation, and the rotational angle.

(Supplementary Note 2)

In the method of Supplementary Note 1 above, the substrate processing apparatus is connected to a vacuum transfer chamber in which a transfer arm that transfers the substrate is provided, and the arm is the transfer arm.

(Supplementary Note 3)

In the method of Supplementary Note 2 above, the vacuum transfer chamber includes a detector configured to detect the position of the substrate transferred by the transfer arm, and in the detecting of the initial position of the substrate, the initial position of the substrate is detected by using the detector when the substrate is loaded into the processing container from the vacuum transfer chamber, and in the detecting of the position of the substrate after rotation, the position of the substrate after rotation is detected by using the detector when the substrate after rotation is unloaded from the processing container to the vacuum transfer chamber.

(Supplementary Note 4)

In the method of Supplementary Note 1 above, the processing container includes a plurality of processing spaces defined inside the processing container, each of which is provided with the substrate stage, the substrate processing apparatus includes a rotation arm which is equipped with a plurality of end effectors configured to hold the substrate placed on the substrate stage of each of the processing spaces, and the arm is the rotation arm.

(Supplementary Note 5)

In the method of Supplementary Note 4 above, the substrate processing apparatus includes a detector configured to detect the position of the substrate, at a position on a rotation trajectory of the substrate held by the rotation arm, and in the detecting of the initial position of the substrate, the initial position of the substrate is detected by using the detector when the substrate is transferred by the rotation of the rotating arm, and in the detecting of the position of the substrate after rotation, the position of the substrate after rotation is detected by using the detector when the substrate after rotation is transferred by the rotation of the rotation arm.

(Supplementary Note 6)

In the method of any one of Supplementary Notes 1 to 5 above, in the detecting of the initial position of the substrate, an initial position of a center of the substrate is detected, in the detecting of the position of the substrate after rotation, a center position of the substrate after rotation is detected, and in the calculating of the positional deviation amount of the substrate stage, a deviation amount of a center position of the substrate stage with respect to the initial position of the center of the substrate is calculated based on the initial position of the center of the substrate, the center position of the substrate after rotation, and the rotational angle.

(Supplementary Note 7)

In the method of any one of Supplementary Notes 1 to 6 above, a process including the detecting of the initial position of the substrate to the calculating of the positional deviation amount of the substrate stage is executed in a state in which the processing container and the substrate stage are heated.

(Supplementary Note 8)

The method of any one of Supplementary Notes 1 to 7 above further comprises: adjusting the position of the substrate stage based on the calculated deviation amount.

(Supplementary Note 9)

The method of any one of Supplementary Notes 1 to 8 above further includes: adjusting a transfer position of the substrate by the arm based on the calculated deviation amount.

(Supplementary Note 10)

A substrate processing apparatus includes: a processing container; a substrate stage provided rotatably inside the processing container; and a controller, wherein the controller is configured to control the processing container and the substrate stage to execute: detecting an initial position of a substrate transferred by an arm that transfers the substrate; placing the substrate on the substrate stage; rotating the substrate by a predetermined rotational angle by rotating the substrate stage; delivering the substrate after rotation from the substrate stage to the arm; detecting a position of the substrate after rotation transferred by the arm; and calculating a positional deviation amount of the substrate stage with respect to the initial position of the substrate based on the initial position of the substrate, the position of the substrate after rotation, and the rotational angle.

According to the present disclosure, it is possible to measure a relative positional deviation amount between a substrate stage and a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of measuring a positional deviation of a substrate stage in a substrate processing apparatus provided rotatably inside a processing container, the method comprising:

detecting an initial position of a substrate transferred by an arm that transfers the substrate;

placing the substrate on the substrate stage;

rotating the substrate by a predetermined rotational angle by rotating the substrate stage;

delivering the substrate after rotation from the substrate stage to the arm;

detecting a position of the substrate after rotation transferred by the arm; and calculating a positional deviation amount of the substrate stage with respect to the initial position of the substrate based on the initial position of the substrate, the position of the substrate after rotation, and the rotational angle.

2. The method of claim 1, wherein the substrate processing apparatus is connected to a vacuum transfer chamber in which a transfer arm that transfers the substrate is provided, and wherein the arm is the transfer arm.

3. The method of claim 2, wherein the vacuum transfer chamber includes a detector configured to detect the position of the substrate transferred by the transfer arm, and wherein, in the detecting of the initial position of the substrate, the initial position of the substrate is detected by using the detector when the substrate is loaded into the processing container from the vacuum transfer chamber, and wherein, in the detecting of the position of the substrate after rotation, the position of the substrate after rotation is detected by using the detector when the substrate after rotation is unloaded from the processing container to the vacuum transfer chamber.

4. The method of claim 1, wherein the processing container includes a plurality of processing spaces defined inside the processing container, each of which is provided with the substrate stage, wherein the substrate processing apparatus includes a rotation arm which is equipped with a plurality of end effectors configured to hold the substrate placed on the substrate stage of each of the processing spaces, and wherein the arm is the rotation arm.

5. The method of claim 4, wherein the substrate processing apparatus includes a detector configured to detect the position of the substrate, at a position on a rotation trajectory of the substrate held by the rotation arm, and wherein, in the detecting of the initial position of the substrate, the initial position of the substrate is detected by using the detector when the substrate is transferred by the rotation of the rotating arm, and wherein, in the detecting of the position of the substrate after rotation, the position of the substrate after rotation is detected by using the detector when the substrate after rotation is transferred by the rotation of the rotation arm.

6. The method of claim 1, wherein, in the detecting of the initial position of the substrate, an initial position of a center of the substrate is detected, and wherein, in the detecting of the position of the substrate after rotation, a center position of the substrate after rotation is detected, and wherein, in the calculating of the positional deviation amount of the substrate stage, a deviation amount of a center position of the substrate stage with respect to the initial position of the center of the substrate is calculated based on the initial position of the center of the substrate, the center position of the substrate after rotation, and the rotational angle.

7. The method of claim 1, wherein a process including the detecting of the initial position of the substrate to the calculating of the positional deviation amount of the substrate stage is executed in a state in which the processing container and the substrate stage are heated.

8. The method of claim 1, further comprising: adjusting the position of the substrate stage based on the calculated deviation amount.

9. The method of claim 1, further comprising: adjusting a transfer position of the substrate by the arm based on the calculated deviation amount.

10. A substrate processing apparatus comprising:

a processing container;

a substrate stage provided rotatably inside the processing container; and a controller, wherein the controller is configured to control the processing container and the substrate stage to execute:

detecting an initial position of a substrate transferred by an arm that transfers the substrate;

placing the substrate on the substrate stage;

rotating the substrate by a predetermined rotational angle by rotating the substrate stage;

delivering the substrate after rotation from the substrate stage to the arm;

detecting a position of the substrate after rotation transferred by the arm; and calculating a positional deviation amount of the substrate stage with respect to the initial position of the substrate based on the initial position of the substrate, the position of the substrate after rotation, and the rotational angle.

* * * * *